(12) United States Patent
Jang et al.

(10) Patent No.: US 10,819,280 B2
(45) Date of Patent: Oct. 27, 2020

(54) CRYSTAL OSCILLATOR AND REFERENCE CLOCK GENERATOR INCLUDING SAME

(71) Applicant: SAMSUNG ELECTRONICS CO., LTD., Suwon-Si, Gyeonggi-Do (KR)

(72) Inventors: Jae-hyuk Jang, Hwaseong-si (KR);
Shin-woong Kim, Suwon-si (KR);
Young-min Kim, Suwon-si (KR);
Jae-young Kim, Hwaseong-si (KR);
Chul-ho Kim, Hwaseong-si (KR);
Sang-wook Han, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/440,239

(22) Filed: Jun. 13, 2019

(65) Prior Publication Data
US 2020/0021245 A1    Jan. 16, 2020

(30) Foreign Application Priority Data
Jul. 13, 2018  (KR) .......................... 10-2018-0081752

(51) Int. Cl.
| | |
|---|---|
| *H03B 5/36* | (2006.01) |
| *G04F 5/06* | (2006.01) |
| *H03K 3/354* | (2006.01) |
| *H03K 5/156* | (2006.01) |
| *H03B 5/06* | (2006.01) |

(52) U.S. Cl.
CPC .............. *H03B 5/364* (2013.01); *H03B 5/06* (2013.01); *H03K 5/1565* (2013.01)

(58) Field of Classification Search
CPC .......... H03B 5/364; H03B 5/06; H03B 5/368; H03K 5/1565
USPC ...... 331/154, 158, 116 FE, 116 R, 182, 183, 331/185, 186
See application file for complete search history.

(56) References Cited

U.S. PATENT DOCUMENTS

| | | | |
|---|---|---|---|
| 6,798,301 B1 * | 9/2004 | Balan ..................... | H03B 5/366 331/109 |
| 7,061,338 B2 | 6/2006 | Arigliano | |
| 7,292,114 B2 | 11/2007 | Greenberg | |
| 8,232,848 B2 * | 7/2012 | Kato .................. | H03F 3/45183 331/183 |
| 8,816,786 B2 * | 8/2014 | Tham ...................... | H03L 5/00 331/109 |
| 9,209,747 B1 | 12/2015 | Sinha et al. | |
| 9,350,294 B2 | 5/2016 | Calhoun et al. | |
| (Continued) | | | |

*Primary Examiner* — Richard Tan
(74) *Attorney, Agent, or Firm* — F. Chau & Associates, LLC (57) ABSTRACT

A crystal oscillator including a feedback circuit, and a reference clock generating circuit including the crystal oscillator. The crystal oscillator is configured to generate an oscillating signal based on a natural frequency of a crystal. The crystal oscillator may include: a current generating circuit connected to a first node having a first voltage and a second node having a second voltage, and configured to output a first current to the second node; a feedback circuit connected to the generating circuit via the first and second nodes and configured to adjust a level of the second voltage by controlling a level of the first voltage; and a crystal circuit connected to the second node and configured to generate the oscillating signal based on the second voltage.

19 Claims, 8 Drawing Sheets

(56) References Cited

U.S. PATENT DOCUMENTS

| | | |
|---|---|---|
| 2007/0013456 A1* | 1/2007 | Lee .......... H03B 5/06 |
| | | 331/182 |
| 2010/0259335 A1 | 10/2010 | Martin |
| 2012/0092079 A1 | 4/2012 | Huang |
| 2012/0326794 A1 | 12/2012 | Kammula |
| 2015/0180412 A1* | 6/2015 | Lin .......... H03B 5/1243 |
| | | 331/117 FE |
| 2016/0065132 A1 | 3/2016 | Watanabe et al. |
| 2016/0218671 A1* | 7/2016 | Jun .......... H03B 5/362 |

* cited by examiner

CRYSTAL OSCILLATOR AND REFERENCE CLOCK GENERATOR INCLUDING SAME

CROSS-REFERENCE TO RELATED APPLICATION

This application claims the benefit of Korean Patent Application No. 10-2018-0081752, filed on Jul. 13, 2018, in the Korean Intellectual Property Office, the disclosure of which is incorporated herein by reference in its entirety.

TECHNICAL FIELD

This disclosure relates to crystal oscillators and reference clock generating circuits including a crystal oscillator.

DISCUSSION OF RELATED ART

A communication device such as a radio frequency integrated chip (RFIC) or a serial communication device may transmit or receive signals based on a reference clock that periodically indicates logic high and logic low in sync with a fixed frequency signal. Accordingly, a reference clock generating circuit that generates a reference clock for transmitting signals may be included within the communication device. The reference clock generating circuit may receive a fixed frequency signal from an oscillator to generate a reference clock having a fixed frequency. A crystal oscillator, which generates a fixed frequency signal based on the intrinsic frequency of a piezoelectric crystal resonator ("crystal"), may be used as the oscillator.

A crystal oscillator is a device that typically employs an amplifier and a crystal to generate a fixed frequency signal. The crystal is made from of a small slice of piezoelectric material having a shape that physically resonates at a desired (natural) frequency, such that the crystal acts like a filter having a bandpass around its natural frequency. The natural frequency is a function of a process type and size of the crystal. The fixed frequency signal of the crystal oscillator is variable according to the crystal's natural frequency and frequency tuning circuitry coupled to the crystal. Thus, the crystal oscillator is formed by a combination of the crystal within a circuit that resonates at or near the natural frequency of the crystal. However, the range of frequency adjustment by the frequency tuning circuitry is limited.

SUMMARY

Embodiments of inventive concept provide a crystal oscillator configured to generate a feedback loop with respect to a current generating circuit by including a feedback circuit, and a reference clock generating circuit including the crystal oscillator.

According to an aspect of the inventive concept, there is provided a crystal oscillator configured to generate an oscillating signal based on a natural frequency of a crystal. The crystal oscillator may include a current generating circuit connected to a first node having a first voltage and a second node having a second voltage, where the current generating circuit is configured to output a first current to the second node. A feedback circuit may be connected to the current generating circuit via the first and second nodes and may be configured to adjust a level of the second voltage by controlling a level of the first voltage. A crystal circuit may be connected to the second node and configured to generate the oscillating signal based on the second voltage.

According to another aspect of the inventive concept, there is provided a crystal oscillator configured to generate an oscillating signal based on a natural frequency of a crystal. The crystal oscillator may include: a first transistor including an end to which a supply voltage is applied and a gate terminal connected to a first node; a second transistor including a gate terminal to which a reference voltage is applied, a first end connected to another end of the first transistor, and a second end connected to a second node; a crystal circuit connected between the second node and a fourth node; and an operational amplifier (OPAMP) having an output terminal connected to the first node, a first input terminal connected to the second node, and a second input terminal connected to a third node. The crystal circuit may generate the oscillating signal based on a second voltage at the second node.

According to another aspect of the inventive concept, there is provided a reference clock generating circuit including: a crystal oscillator configured to generate an oscillating signal based on a natural frequency of a crystal; and a clock generator configured to generate a clock signal based on the oscillating signal. The crystal oscillator may include: a current generating circuit configured to receive a first voltage from a first node and adjust, based on a current control signal received from the clock generator, an amount of a first current that is output to a second node; a feedback circuit configured to adjust a level of a second level to be approximately equal to a level of a third voltage by controlling the first voltage via a feedback operation with respect to a current generating circuit; and a crystal circuit connected between the second node and a fourth node and configured to generate the oscillating signal based on the second voltage.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Hereinafter, example embodiments of the inventive concept will be described with reference to the accompanying drawings. Like elements will be denoted by like reference numerals throughout, and redundant descriptions thereof will be omitted.

Herein, the term "circuit" may be used to refer to either to a stand-alone closed loop circuit, or to circuitry that forms just a portion of a stand-alone closed loop circuit. Thus, the term "circuit" may be used herein for brevity to mean "circuitry" or "circuit part".

Herein, the term "end of a transistor" may be used for brevity to mean a conducting terminal other than a control (e.g. gate) terminal. In the case of a field effect transistor (FET), an "end" is a drain or a source terminal.

Herein, the term "crystal circuit" refers to a circuit that includes at least one piezoelectric crystal resonator along with other circuitry that enables the piezoelectric crystal resonator to generate an oscillating signal.

Herein, for brevity, any element, signal, voltage or other variable may be referred to interchangeably just by its previously introduced legend or its basic functional name plus its legend. For example, a "first tuning capacitor Ct1" may be later referred to as just "Ct1" or "capacitor Ct1"; a "first frequency tuning circuit 150_1" may be later referred to as a "tuning circuit 150_1" or just "circuit 150_1"; a voltage V1 may be later referred to as just "V1"; etc.

Figure 1:
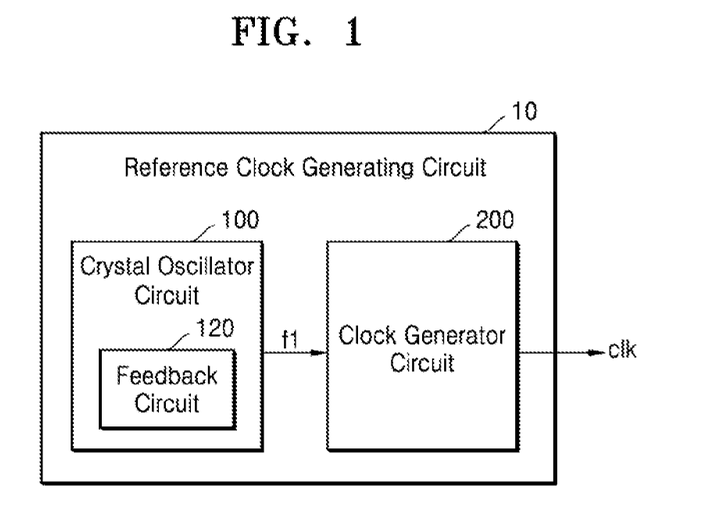
FIG. 1 is a block diagram showing a reference clock generating circuit, according to an example embodiment.

FIG. 1 is a block diagram showing a reference clock generating circuit, 10, according to an example embodiment. The reference clock generating circuit 10 may include a crystal oscillator circuit ("crystal oscillator") 100 and a clock generator circuit 200. The crystal oscillator 100 may, by resonating a piezoelectric crystal resonator (hereafter, "crystal") included therein, generate an oscillating signal f1 at or near a natural frequency of the crystal. The oscillating signal f1 may be a sinusoidal signal which is output to the clock generator 200. The clock generator 200 may generate a reference clock clk by alternately switching logic high and logic low based on the oscillating signal f1. The reference clock clk may thereby be generated substantially as a square wave.

The crystal oscillator 100 may include a feedback circuit 120. The feedback circuit 120 may generate a feedback loop for a voltage generating circuit included in the crystal oscillator 100. According to the inventive concept, the provision of the feedback loop may serve to reduce noise within an output current generated by the current generating circuit. Although crystal oscillator 100 may initially generate the oscillating signal f1 from a DC voltage by amplifying and feeding back noise, noise may be reduced in the output signal f1 in a steady state condition. This noise reduction may allow for a widening of a frequency adjustment range with respect to the crystal by reducing parasitic capacitance in the current generating circuit, as will be explained hereafter.

Figure 2:
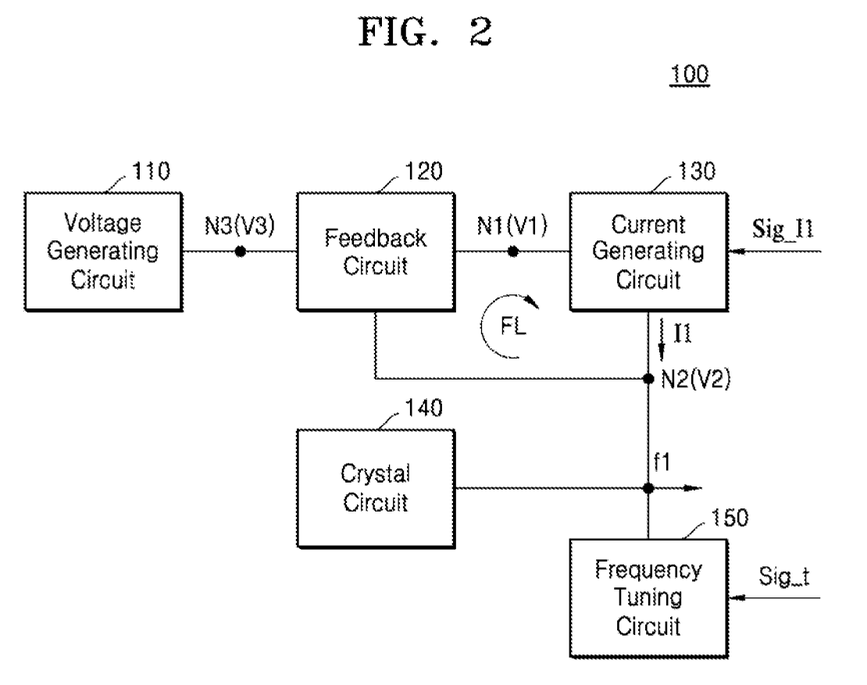
FIG. 2 is a block diagram illustrating a crystal oscillator according to an example embodiment.

FIG. 2 is a block diagram showing the crystal oscillator 100 according to an example embodiment. Crystal oscillator 100 may include a voltage generating circuit 110, the feedback circuit 120, a current generating circuit 130, a crystal circuit 140, and a frequency tuning circuit 150.

The current generating circuit 130 may be connected to a first node N1 and a second node N2, generate a first current I1 based on a first voltage V1 at the first node N1, and output, to a second node N2, the generated first current I1. In an embodiment, the current generating circuit 130 may receive an externally provided current control signal Sig_I1 and adjust a current level of the first current I1 based on the current control signal Sig_I1. The current generating circuit 130 may be (or include) a digitally controlled current source (DCCS).

The voltage generating circuit 110 may be connected to a third node N3 and output a third voltage V3 to the third node N3. According to operations of the voltage generating circuit 110, a voltage level of the third voltage V3 may be uniformly maintained.

The feedback circuit 120 may be connected to the current generating circuit 130 via the first node N1 and the second node N2, thereby forming a feedback loop FL for the current generating circuit 130. The feedback circuit 120 may, based on a second voltage V2 of the second node N2, control a first voltage V1 at the first node N1. As the feedback circuit 120 controls the first voltage V1, this may change the first current I1 output by the current generating circuit 130, and thus the second voltage V2 may be adjusted. In other words, the feedback circuit 120 may control the first voltage V1, and accordingly the voltage level of the second voltage V2 may be adjusted.

The feedback circuit 120 may be connected to the voltage generating circuit 110 via the third node N3. The feedback circuit 120 may control the first voltage V based on the third voltage V3 at the third node N3. In an embodiment, the feedback circuit 120 may, by controlling the first voltage V1, adjust the level of the second voltage V2 to be identical to that of the third voltage V3.

The crystal circuit 140 may include an amplifier (e.g. a single transistor T4 of FIG. 3, discussed later) and a crystal in a feedback path of the amplifier, where the crystal may be a slice of piezoelectric material with a pair of electrodes on opposing sides thereof. The crystal circuit 140 may be connected to the second node N2 and generate the oscillating signal f1 by oscillating at a constant frequency based on the second voltage V2 at the second node N2. For instance, as the second voltage V2 causes the crystal to resonate, the crystal may oscillate uniformly at or near its natural frequency. As mentioned earlier, when the crystal oscillates at its natural frequency, a clock having a clock frequency equaling the natural frequency may be generated from the (sinusoidal) oscillating signal f1. The oscillating signal f1 may be output to the clock generator circuit 200 at the node N2.

The frequency tuning circuit 150 may be connected to the crystal circuit 140 and adjust, based on a tuning signal Sig_t received from an external source, the frequency that is resonated by the crystal circuit 140. The frequency resonated by the crystal circuit 140 may differ from a target frequency due to various causes (for example, differences in processes regarding the crystal). Accordingly, the frequency of oscillating signal f1 may be adjusted to equal the target frequency through use of the frequency tuning circuit 150.

Figure 3:
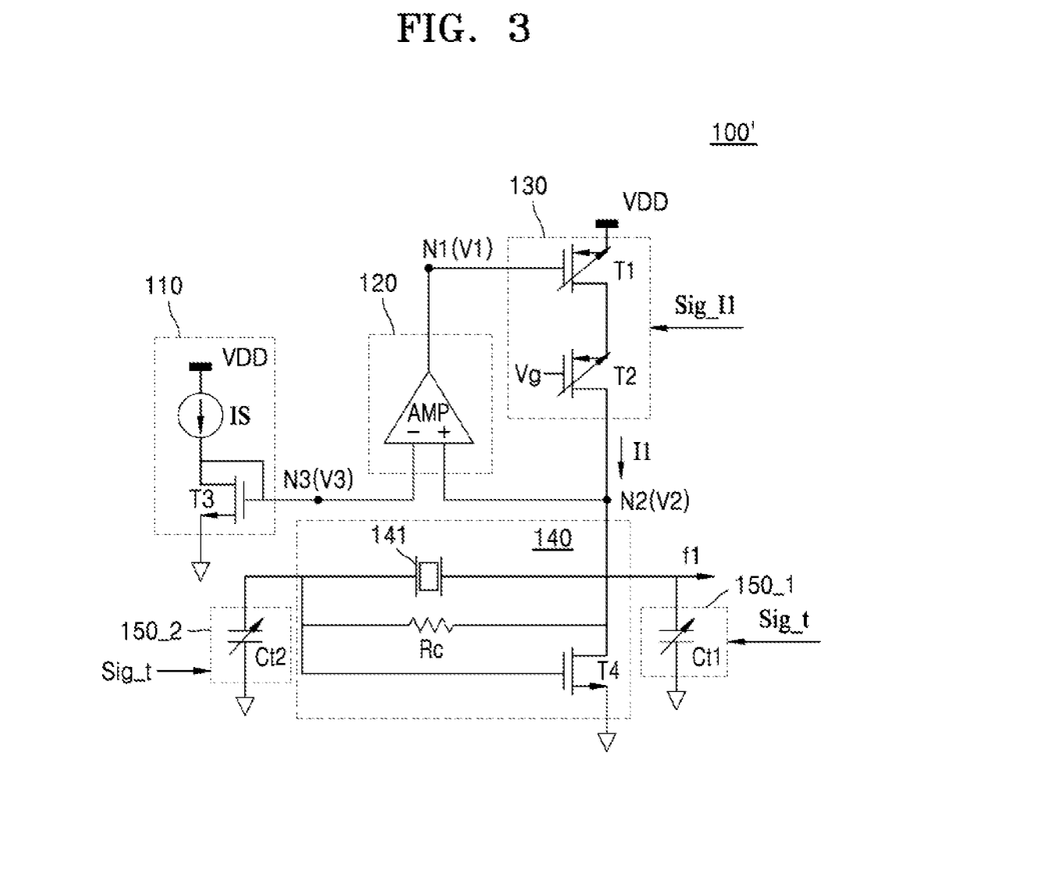
FIG. 3 is a circuit diagram illustrating a crystal oscillator according to an example embodiment.

FIG. 3 is a block diagram of a crystal oscillator 100', which is an embodiment of the crystal oscillator 100 of FIG. 1. Crystal oscillator 100' may include the voltage generating circuit 110, the feedback circuit 120, the current generating circuit 130, the crystal circuit 140, and the frequency tuning circuit 150 embodied as first and second frequency tuning circuits 150_1, 150_2 (exemplified as adjustable capacitors). The crystal circuit 140 may include a crystal 141 connected across the drain to gate of a FET transistor T4, and a resistor Rc. The crystal circuit and the capacitors Ct1, Ct2 may together form a Pierce-type crystal oscillator. The transistor T4 may act as an amplifier to amplify and feed back noise to generate, in conjunction with the crystal 141, the capacitors Ct1, Ct2, and the resistor Rc, the oscillating signal f1. Note that other crystal circuit configurations may be substituted.

The current generating circuit 130 may include a first transistor T1 and a second transistor T2. The first and second transistors T1, T2 may be dynamic transistors that control an amount of the first current I1 based on the current control signal Sig_I1 which may be suitably applied thereto. (Alternatively, transistors T1, T2 are fixed transistors rather than dynamic transistors, and the control signal Sig_I1 is not applied; these options are discussed below.) As an example, each of the transistors T1, T2 may be a "dynamically sized transistor" that adjusts a length of a gate terminal thereof based on the current control signal Sig_I1, and accordingly a current level of the first current I1 may be adjusted. For instance, gate terminal length may be dynamically adjusted by turning fingers of the transistor T1 or T2 on or off in accordance with the signal SigI1, where more turned-on fingers of the transistor T1 or T2 results in a higher first current I1.

Although not shown, in another example, the current generating circuit 130 may further or alternatively include a plurality of transistors connected in parallel between the nodes N1 and N2. Each of these plurality of transistors may adjust the current level of the first current I1 by controlling its own connection between a supply voltage VDD and the second node N2 based on the current control signal Sig_I1 suitably applied to each parallel connected transistor. When the plurality of parallel connected transistors are utilized, each parallel connected transistor (including transistors T1 and T2) may be either a dynamically sized transistor or a fixed size transistor. It is further noted that in FIG. 3, transistors T1 and T2 are exemplified as p-channel FETs, in which the source of T1 is connected to a terminal receiving VDD; the drain of T1 connects to the source of T2; and the drain of T2 connects to the node N2. However, n-channel FETs may be substituted. Likewise, it may be possible to substitute p-channel FETs for the exemplary n-channel FETs shown for transistors T3 and T4. In still another modification, transistors T1 and T2 as shown in FIG. 3 are embodied as fixed size transistors, and the signal Sig_I1 is not applied. Further, it is possible to omit transistor T2 in still another embodiment.

Aside from transistor size control, the first transistor T1 may control the amount of the first current I1 based on the first voltage V1 at the first node N1, and the second transistor T2 may control the first current I1 through use of a gate voltage Vg applied as a bias.

The voltage generating circuit 110 may include a current source IS and a third transistor T3, and may control the third voltage V3 output at the third node N3 to be maintained at a constant value.

The first and second frequency tuning circuits 150_1 and 150_2 may be comprised of (or include) first and second tuning capacitors Ct1 and Ct2, respectively. Capacitors Ct1, Ct2 may each be comprised of multiple, parallel connected capacitors that may be switched in/out of circuit connection via a respective series connected switch controlled by signal Sig_t, thereby adjusting the overall capacitance of Ct1, Ct2. The design and adjustment of the capacitors Ct1, Ct2 may be premised on the assumption that the crystal 141 may be represented as an equivalent circuit including a resistor, a capacitor, and an inductor. The crystal 141 may oscillate at a natural frequency through charging and discharging operations of capacitors Ct1 and Ct2. The frequency of the oscillating signal f1 (output at node N2) generated by the crystal oscillator 100', may be expressed as a function of the equivalent resistor, capacitor, and inductor of crystal 141 and the first and second tuning capacitors Ct1, Ct2. Accordingly, as capacitance values of Ct1 and Ct2 are adjusted, the frequency of the oscillating signal f1 generated by the crystal oscillator 100' may be adjusted.

The feedback circuit 120 may be comprised of (or include) an operational amplifier (AMP) having a first input terminal (e.g., a positive input terminal) connected to the second node N2, a second input terminal (e.g., a negative input terminal) connected to the third node N3, and an output terminal connected to the first node N1. An input impedance of the AMP is very high and an output impedance of the AMP is very low; therefore, with the use of negative feedback, the AMP may be understood to have an "imaginary short" between its input terminals (also known as a "virtual short" of an op-amp) to maintain approximately the same electric potential between the first and second input terminals. In other words, if the first and second input terminals are at the same potential, a short circuit may be "imagined" between the first and second input terminals. Due to the imaginary short phenomenon of the AMP, the level of the second voltage V2 at the second node N2 may be forced to be nearly equal to that of the third voltage V3 at the third node N3.

In addition, the AMP may output the first voltage V1 to the first node N1 by amplifying a small difference between the second voltage V2 and the third voltage V3, that is, a difference in voltages between input terminals, by an amplification gain. When the noise in the first node N1 is Vn1, the amplification gain in the AMP is A, an equivalent impedance in the second node N2 is zn2 (which may be equivalent impedance looking towards node N2 from the positive input terminal of AMP), and a mutual conductance of the first transistor T1 is gm, then noise Vn2, which is output to the second node N2 by the feedback loop, may be generated according to Equation 1 as follows:

$$Vn2 = \frac{Vn1 \times gm \times Zn2}{1 + A \times gm \times Zn2} \approx \frac{Vn1}{A}. \qquad \text{(Equation 1)}$$

Thus, according to embodiments of the inventive concept, owing to the FL formed due to insertion of the AMP, the noise that may be present in ("riding on") the second voltage V2 may be reduced (relative to that of V1) by a factor approximately equaling the amplification gain A.

Various noise may ride on the first current I1 output from the first transistor T1 and the second transistor T2. Noise in the first current I1 may be reduced by enlarging sizes (for example, lengths of channels) of transistors T1 and T2 such as by on/off finger switching discussed above, but as the sizes of the transistors T1 and T2 are enlarged, a parasitic capacitance of the second node N2 corresponding to transistors T1 and T2 also increases. Due to such an increase in the parasitic capacitance, an adjustable range of the capacitance of the first and second capacitors Ct1, Ct2 may decrease, and thus a spectrum of obtainable frequency for the oscillating signal f1 also decreases.

According to the inventive concept, the AMP may uniformly maintain the voltage level of the second voltage V2 by means of the above-discussed imaginary short effect and reduce the noise, which may occur in the first voltage V1, by the amplification gain A according to Eqn. 1. Accordingly, the noise in the second voltage V2 may be reduced, and the increase in the parasitic capacitance in the second node N2, which is otherwise due to the increase in the sizes of the transistors T1, T2 may be prevented. Because the noise is reduced through use of the AMP, the signal Sig_I1 may indicate a command to limit the sizes of transistors T1 and T2 (which are otherwise increased to reduce noise) and thereby prevent a rise in parasitic capacitance thereof. Alternatively, transistors T1, T2 may be provided as fixed, relatively small transistors, and the signal Sig_I1 is not applied. As the increase in the parasitic capacitance of the second node N2 is prevented, capacitances of Ct1, Ct2 in the tuning circuits 150_1, 150_2 may be more freely adjusted, and thus, a spectrum of obtainable frequency for the signal f1 may be broadened.

As mentioned, the crystal circuit 140 may include the node resistor Rc and the fourth transistor T4. The node resistor Rc may uniformly maintain voltages at two opposite ends of the crystal 141. In addition, the fourth transistor T4 may perform switching between the second node N2 and a reference ground as in a conventional Pierce type oscillator.

In alternative embodiments to the crystal oscillator 100' shown in FIG. 3, the transistor T2 may be omitted, whereupon the current generating circuit 130 may only include the first transistor T1. In this case, the drain of T1 (in the case of the p-channel FET shown) may connect directly to the node N2. In yet another embodiment, the current generating circuit 130 may include at least three transistors in series, and/or may include parallel connected transistors as mentioned earlier.

The clock generating circuit 200 (FIG. 1) may be coupled to node N2 to receive the oscillating signal f1. For instance, circuit 200 may be coupled to node N2 through an AC coupling element (not shown), such that the circuit 200 receives just the AC oscillating signal f1 without DC bias.

As noted earlier, the term "crystal circuit" refers to a circuit that includes at least one piezoelectric crystal resonator along with other circuitry that enables the piezoelectric crystal resonator to generate an oscillating signal. In FIG. 3, crystal circuit 140 is exemplified by crystal 141, transistor T4 and resistor Rc. However, the crystal circuit 140 together with the frequency tuning circuit 150 may also be referred to, collectively, as a "crystal circuit".

Figure 4:
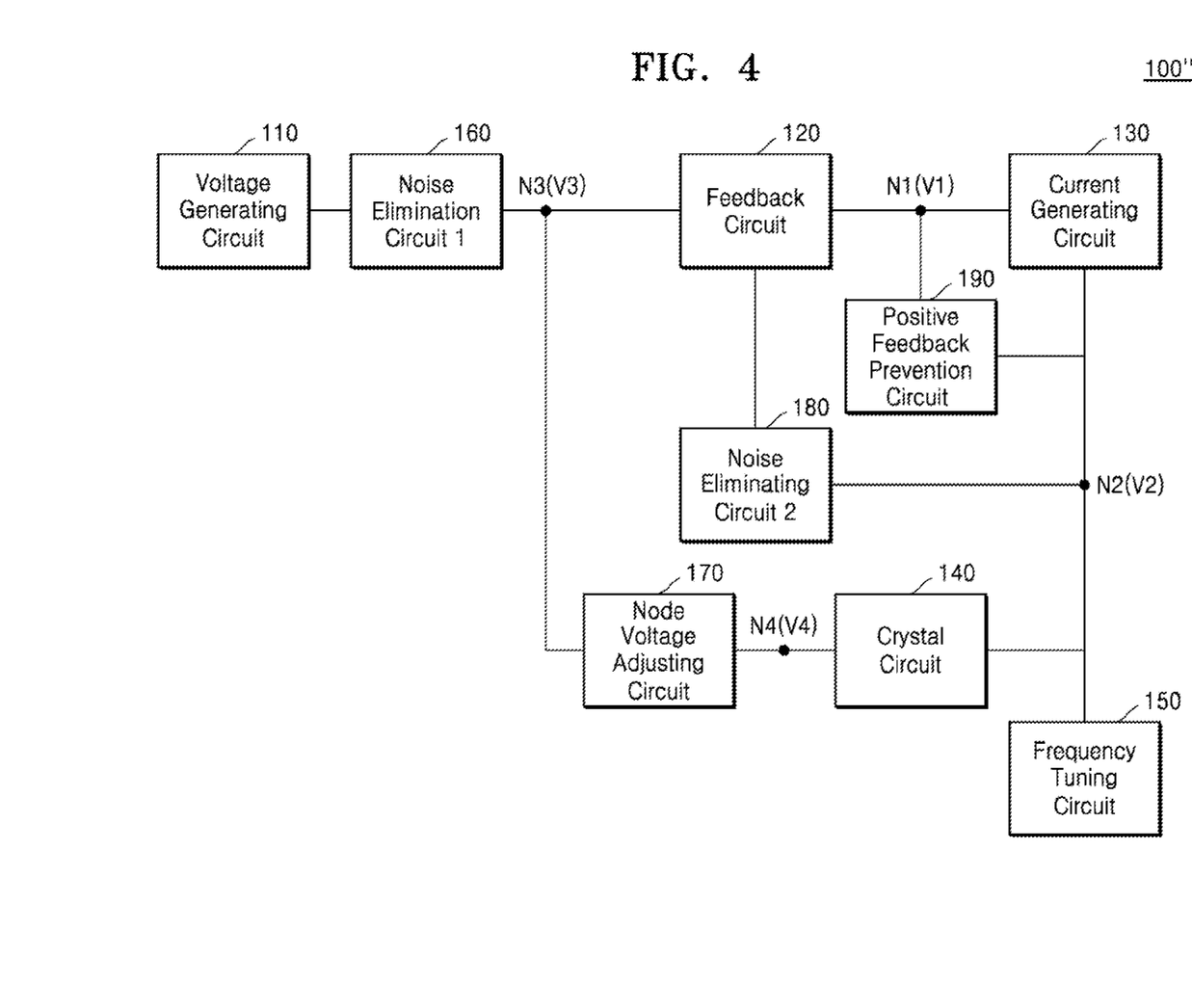
FIG. 4 is a block diagram illustrating a crystal oscillator according to an example embodiment.

FIG. 4 is a block diagram of a crystal oscillator, 100", which is another embodiment of crystal oscillator 100 of FIG. 1. Crystal oscillator 100" may include the above-described voltage generating circuit 110, feedback circuit 120, current generating circuit 130, crystal circuit 140, and frequency tuning circuit 150, and may further include a first noise eliminating circuit 160, a node voltage adjusting circuit 170, a second noise eliminating circuit 180, and a positive feedback prevention circuit 190.

The first noise eliminating circuit 160 may be connected between the voltage generating circuit 110 and the third node N3 to eliminate noise that may flow from the voltage generating circuit 110 to the third node N3. The first noise eliminating circuit 160 may block leakage current that may flow from the voltage generating circuit 110 to the third node N3, and noise that may occur due to the flow of the leakage current to the feedback circuit 120 may be reduced. The first noise elimination circuit 160 may be (or include) a low pass filter (LPF), and a DC current generated from the voltage generating circuit 110 may, in spite of the first noise elimination circuit 160, be delivered to the third node N3.

The node voltage adjusting circuit 170 may be connected between the third node N3 and a fourth node N4 (node N4 is connected to one terminal of the crystal circuit 140) and adjust a bias voltage of a fourth voltage V4 at the fourth node N4 to be equal to the third voltage V3 at the third node N3, thereby maintaining the bias voltage of the fourth voltage V4 as a fixed voltage. According to the inventive concept, due to the imaginary short of the feedback circuit 120, the voltage level of the second voltage V2 at the second node N2 is adjusted to be approximately equal to the voltage level of the third voltage V3. Due to the operation of the node voltage adjusting circuit 170, the fourth voltage V4 at the fourth node N4 and the second voltage V2 of the second node N2, which respectively are voltages at two opposite ends of the crystal 140, may have approximately the same voltage levels. Note that current flowing through circuit 170 may be small enough such that the above voltage relationship between V3 and V4 is valid. Further, the approximately equal voltage relationship between V2 and V3 may be maintained even with the second noise eliminating circuit 180 connected between the node N2 and the feedback circuit 120, since only a small current may also flow through circuit 180.

In an alternative circuit configuration, the node voltage adjusting circuit 170 may be connected between the second node N2 and the fourth node N4, instead of between nodes N3 and N4. In this case, circuit 170 may similarly maintain the voltage levels at the second node N2 and the fourth node N4 at approximately equal levels.

The second noise eliminating circuit 180 may be connected between the feedback circuit 120 and the second node N2 to eliminate noise that may occur in the feedback circuit 120. In some cases, the feedback circuit 120 may have a parasitic capacitance that may constrain the adjustable range of the frequency tuning circuit 150 via the second node N2. The second noise eliminating circuit 180, which is between circuits 120 and 150, reduces such a parasitic capacitance effect on tuning circuit 150.

The positive feedback prevention circuit 190, connected between nodes N1 and N2, may maintain a phase margin between nodes N1 and N2 and thereby prevent signal folding that may occur due to positive feedback in the second node N2. In an embodiment, the positive feedback prevention circuit 190 may prevent signal folding by maintaining different phases between the first and second voltages V1, V2 at nodes N1, N2.

Figure 5:
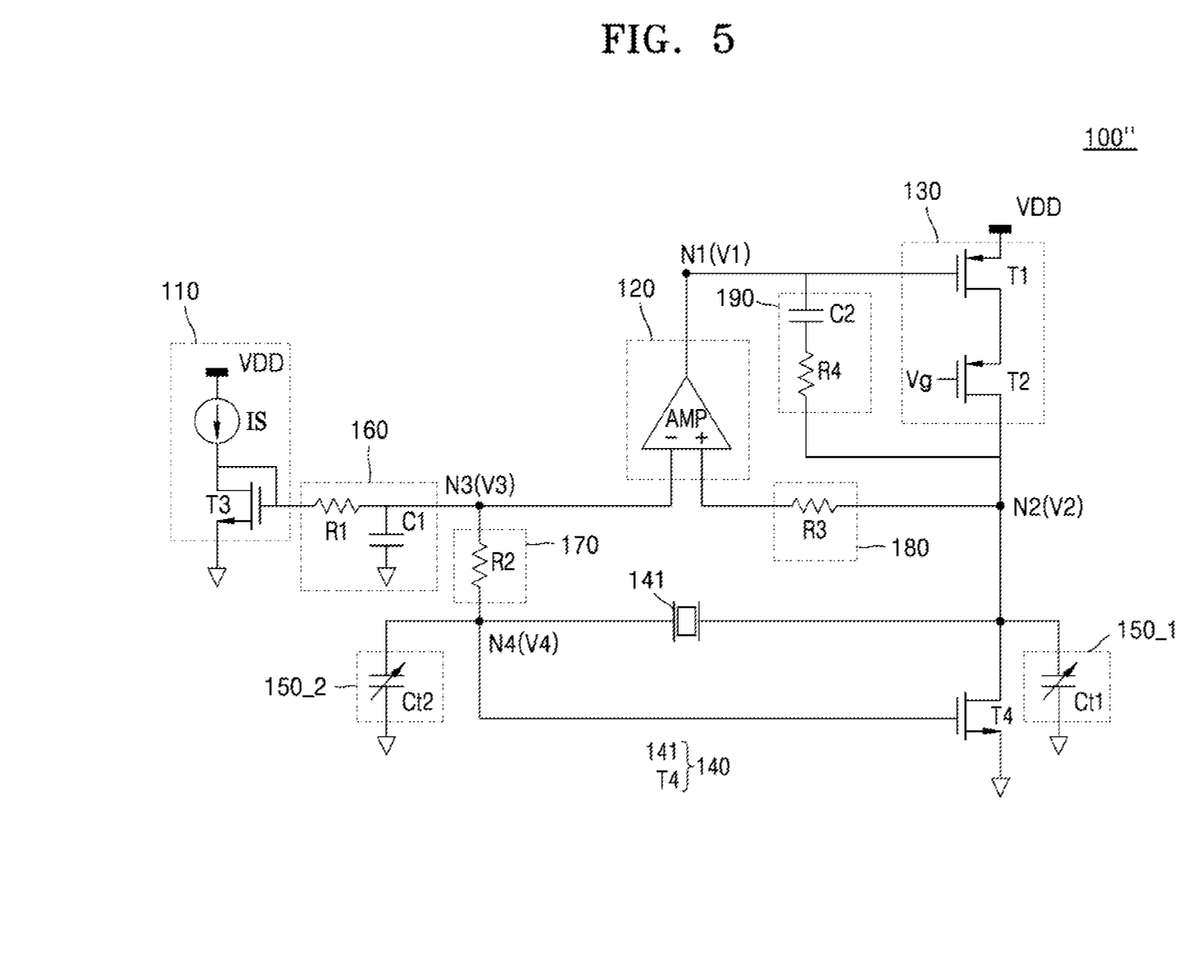
FIG. 5 is a circuit diagram illustrating a crystal oscillator according to an example embodiment.

FIG. 5 is a circuit diagram of an example embodiment of the crystal oscillator 100" of FIG. 4, in which example configurations for the individual elements of FIG. 4 are depicted. Here, the first noise eliminating circuit 160 may include a first resistor R1 connected between the third node N3 and the voltage generating circuit 110 and a first capacitor C1 connected between the third node N3 and a reference ground. In an embodiment, the first resistor R1 and the first capacitor C1 may form an LPF, and from among the voltages generated from the voltage generating circuit 110, only the third voltage V3, which is a direct current (DC) component, may be applied to the third node N3 via the first noise eliminating circuit 160. Accordingly, AC noise which may be generated from the voltage generating circuit 110, may be eliminated. In addition, the first resistor R1 may prevent the leakage current, which may be generated from the voltage generating circuit 110, from flowing into the third node N3. It is noted here that alternative noise prevention circuit configurations for the first noise eliminating circuit 160 shown in FIG. 5 may be substituted.

The node voltage adjusting circuit 170 may be embodied as (or include) a second resistor R2 connected between the third and fourth nodes N3, N4. The second resistor R2 may connect nodes N3 and N4 to adjust the fourth voltage V4 at node N4 to have a voltage level equaling that of V3. Accordingly, V4 and V2, which respectively are voltages at the two opposite ends of the crystal 141, may have approximately the same voltage levels. Note that in an alternative configuration, node voltage adjusting circuit 170 may, as shown in FIG. 3, maintain the voltage levels of nodes N2 and N4 approximately equal by including a node resistor connected between nodes N2 and N4.

The second noise eliminating circuit 180 may be comprised of or include a third resistor R3 connected between the first input terminal of the AMP and the second node N2. In an embodiment, the AMP may have a relatively large size such that the voltage V2 applied to the second node N2 may have a reduced voltage swing. Accordingly, the parasitic capacitance of the AMP may also increase. The parasitic capacitance of the AMP may have an effect on the first frequency tuning circuit 150_1, and accordingly a range of frequency that may be tuned by the first and second frequency tuning circuits 150_1, 150_2 may decrease.

According to an embodiment, as the third resistor R3 is provided between the first input terminal of the AMP and the second node N2, the effect of the parasitic capacitance of the AMP on the first frequency tuning circuit 150_1 may decrease. As a result, a range of frequency that may be tuned by using the first and second tuning circuits 150_1, 150_2 may be broadened.

The positive feedback prevention circuit 190 may be connected between the first and second nodes N1, N2 and include a second capacitor C2 and a fourth resistor R4 serially connected to each other. As was described in detail with reference to FIG. 2, when the AMP generates the first voltage V1 at node N1 based on the second voltage V2 at node N2, the feedback loop in which the current generating circuit 130 generates V2 based on V1 may be formed, and when phases of V1 and V2 are equal, a positive feedback in which the signal is amplified and has an infinite voltage may occur.

In an embodiment, the second capacitor C2 and the fourth resistor R4 may maintain the first voltage V1 of the first node N1 and the second voltage V2 of the second node N2 to have phases that differ from each other. According to an embodiment, due to insertion of the positive feedback prevention circuit 190, the phases between the first and second voltages V1, V2 are maintained to be different from each other, and accordingly, the positive feedback in the feedback loop including the AMP and the current generating circuit 130 may be prevented.

Figure 6A:
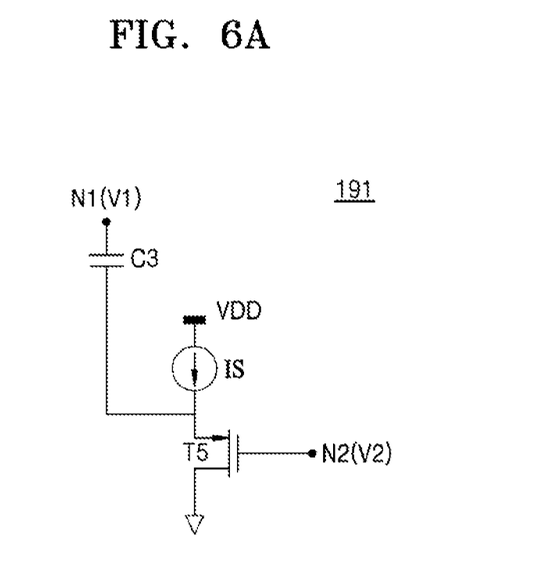
FIG. 6A is a circuit diagram illustrating a positive feedback prevention circuit according to an example embodiment.
Figure 6B:
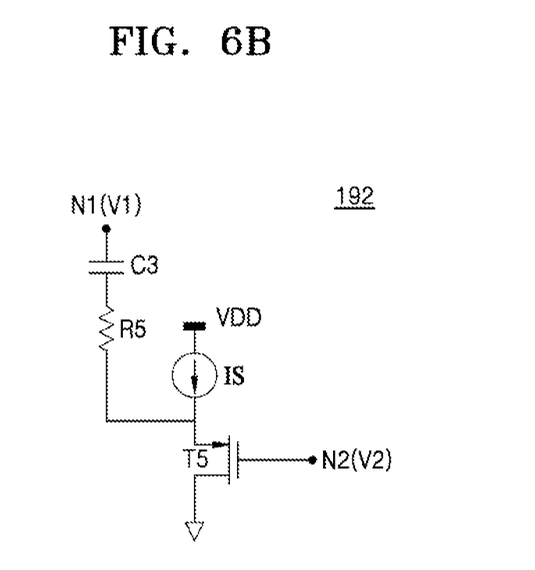
FIG. 6B is a circuit diagram illustrating a positive feedback prevention circuit according to an example embodiment.

Although FIG. 5 shows the positive feedback prevention circuit 190 that maintains the phase margin by including only one capacitor C2 and one resistor R4, other circuit configurations that likewise maintain different phases may be substituted, such as those in FIGS. 6A and 6B.

FIG. 6A is a circuit diagram showing a positive feedback prevention circuit, 191, according to an example embodiment, which may be included within crystal oscillator 100" as a substitute for circuit 190. Circuit 191 may include a third capacitor C3, a current source IS, and a fifth transistor T5. The third capacitor C3 may be connected between the first node N1 and an end (e.g. source) of the fifth transistor T5; the current source IS may be connected between the supply voltage (VDD) node and the end of T5; the gate of T5 may be connected to the second node N2; and the other end (e.g. drain) of T5 may be connected to the reference ground. (Note that if an n-channel transistor is used for T5 of FIG. 6A, circuit connections may change accordingly.)

The third capacitor C3 may stabilize a system by performing pole-split compensation with respect to the feedback loop of the crystal oscillator 100". The feedback loop, which is formed by a connection between the first node N and the second node N2, may add zero on a right-hand plane on a Bode plot by the positive feedback. The fifth transistor T5 and the current source IS that drives T5 may control a voltage swing of the second node N2 by functioning as a source-follower and prevent zero from being added by the positive feedback.

FIG. 6B is a circuit diagram showing a positive feedback prevention circuit, 192, according to another example embodiment. Circuit 192 may include the third capacitor C3, a fifth resistor R5, the current source IS, and the fifth transistor T4. The third capacitor C3 and the fifth resistor R5, which are serially connected to each other, may be connected between the first node N1 and the end of the fifth transistor T5; the current source IS may be connected between the VDD node and the end of T5; the gate of T5 may be connected to the second node N2; and the other end (e.g. drain) of T5 may be connected to the reference ground. (Note that if an n-channel transistor is used for T5 of FIG. 6B, circuit connections may change accordingly.)

The third capacitor C3 and the fifth resistor R5 may, by functioning together as an R-C filter, maintain the phases of the first voltage V1 at the first node N1 and the second voltage V2 at the second node N2 to be different from each other. This phase difference control may prevent the positive feedback in the feedback loop including the AMP and the current generating circuit 130.

The fifth transistor T5 and the current source IS that drives T5 may control the voltage swing of the second node N2 by functioning as a source-follower and prevent zero from being added by the positive feedback.

According to an embodiment of the inventive concept, the crystal oscillator 100" may stably operate the crystal circuit 140 by including the positive feedback prevention circuit 192.

Figure 7:
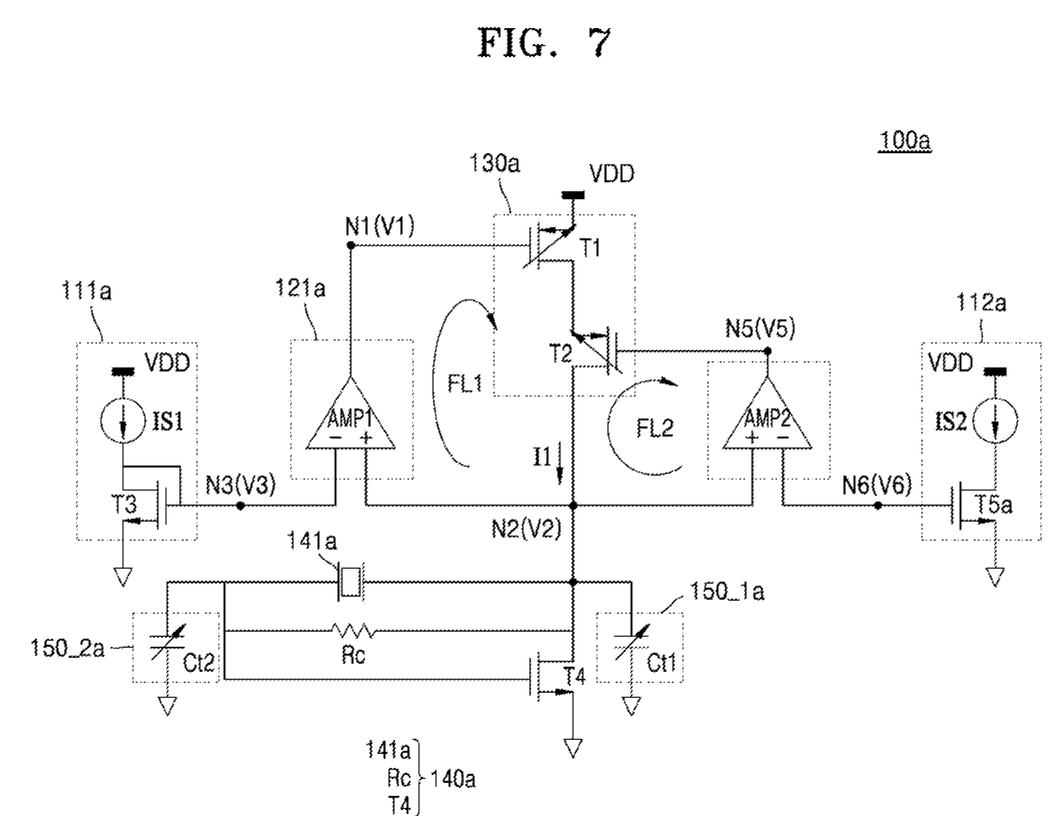
FIG. 7 is a circuit diagram illustrating a crystal oscillator according to an example embodiment.

FIG. 7 is a circuit diagram showing a crystal oscillator 100a according to an example embodiment. Crystal oscillator 100a may include a first voltage generating circuit 111a, a first feedback circuit 121a, a second voltage generating circuit 112a, a second feedback circuit 122a, a current generating circuit 130a, a crystal circuit 140a, and frequency tuning circuits 150_1a and 150_2a.

The current generating circuit 130a may include the first transistor T1 and the second transistor T2. The first transistor T1 may control the current amount of the first current I1 based on the first voltage V1 of the first node N1, and the second transistor T2 may adjust the current amount of the first current I1 based on a fifth voltage V5 at a fifth node N5.

A first voltage generating circuit 111a may include a first current source IS1 and the third transistor T3 and control a third voltage, which is uniform, to be applied to the third node N3. A second voltage generating circuit 112a may include a second current source IS2 and a fifth transistor T5a and control a sixth voltage V6, which is uniform, to be applied to a sixth node N6.

A first feedback circuit 121a may include a first AMP (AMP1): a first input terminal of AMP1 may be connected to the second node N2, a second input terminal of AMP1 may be connected to the third node N3, and an output terminal of AMP1 may be connected to the first node N1. AMP1 may form a first feedback loop FL1 that is described in detail with reference to the feedback loop FL of FIG. 2. The first feedback circuit 121a may, based on the second voltage V2 of the second node N2, control the first voltage V1 of the first node N2.

A second feedback circuit 122a may include a second AMP AMP2: a first input terminal of AMP2 may be connected to the second node N2, a second input terminal of AMP2 may be connected to the sixth node N6, and an output terminal of AMP2 may be connected to the fifth node N5. AMP2 may form a feedback loop FL2 that may be substantially the same as that described in detail with reference to the feedback loop FL of FIG. 2. The second feedback circuit 122a may, based on the second voltage V2 of the second node N2, control the fifth voltage V5 of the fifth node N5.

With crystal oscillator 100a, by providing a plurality of feedback loops (e.g., the first and second feedback loops FL1, FL2) formed due to the insertion of a plurality of AMPs (e.g. AMP1, AMP2), noise within the second voltage V2 may decrease.

Although not shown in FIG. 7, it will be understood by one of ordinary skill in the art that the crystal oscillator 100a may further include the first noise eliminating circuit 160, the node voltage adjusting circuit 170, the second noise eliminating circuit 180, and the positive feedback prevention circuit 190 that are described in detail with reference to FIGS. 4 through 6B.

Figure 8:
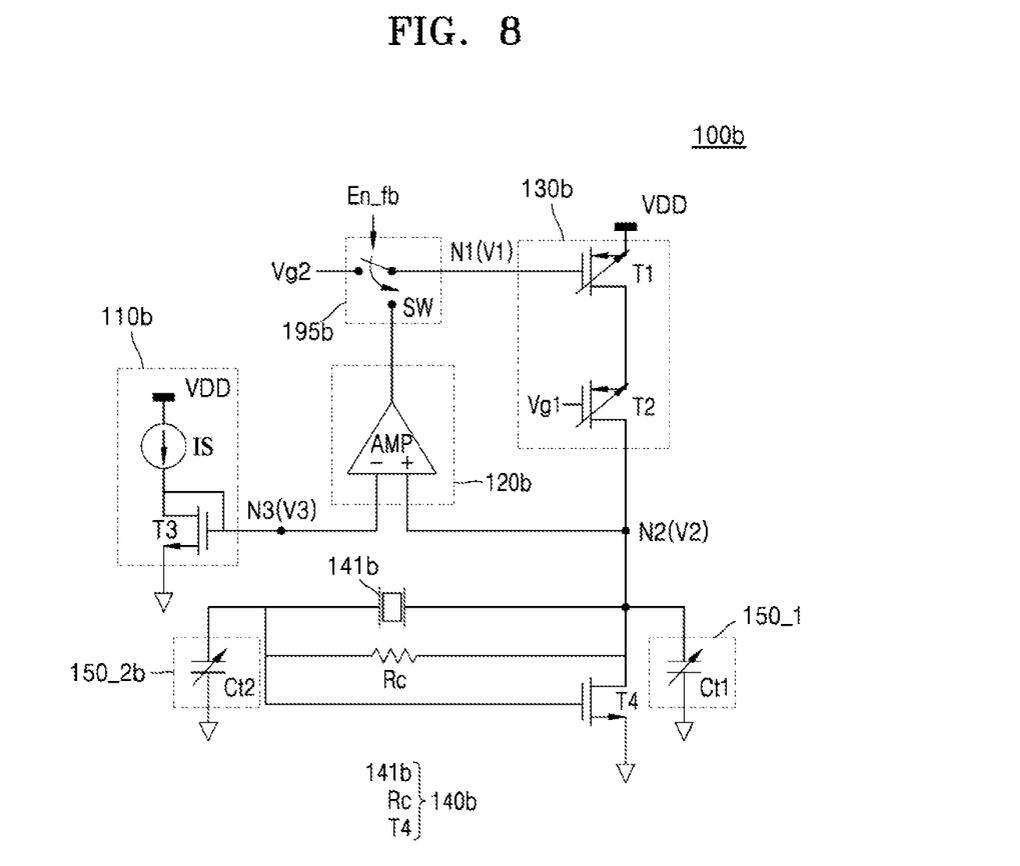
FIG. 8 is a circuit diagram illustrating a crystal oscillator according to an example embodiment.

FIG. 8 is a block diagram showing a crystal oscillator 100b according to an example embodiment. Crystal oscillator 100b may include a voltage generating circuit 110b, a feedback circuit 120b, a current generating circuit 130b, a crystal circuit 140b, frequency tuning circuits 150_1b and 150_2b, and a feedback switching circuit 195b. The operation of analogously labeled elements may be substantially the same as those of FIG. 3.

The feedback switching circuit 195b may include at least one switching device SW that selectively connects the output terminal of the AMP and a second gate voltage Vg2 to the first node N1 based on a feedback enable signal En_fb. In an embodiment, when the feedback enable signal En_fb is at a first logic level, e.g. logic high ('1'), the feedback switching circuit 195b may form a feedback loop by connecting the first node N1 and the output terminal of the AMP. Accordingly, the second voltage V2 that is fed back by the AMP may be applied to the second node N2.

When the feedback enable signal En_fb is at a second, logic level, e.g. logic low ('0'), the feedback switching circuit 195b may not form the feedback loop by applying the second gate voltage Vg2 to the first node N1, and the second voltage V2, which is not fed back to the AMP, may be applied to the second node N2. It is noted here that alternative circuit configurations may be substituted for the switch SW to perform the same functionality of selectively performing the feedback operation by selectively including a feedback loop with the AMP, based on the signal En_fb.

Although not shown in FIG. 8, it will be understood to one of ordinary skill in the art that the crystal oscillator 100b may further include the first noise eliminating circuit 160, the node voltage adjusting circuit 170, the second noise eliminating circuit 180, and the positive feedback prevention circuit 190 that are described in detail with reference to FIGS. 4 through 6B.

Figure 9:
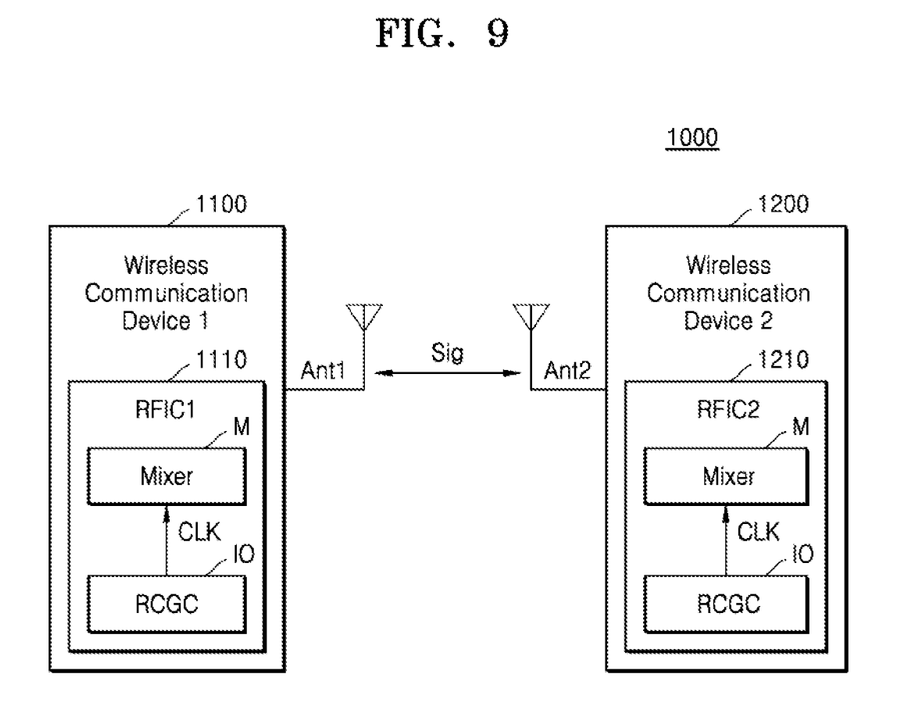
FIG. 9 is a block diagram illustrating a wireless communication system according to an example embodiment.

FIG. 9 is a block diagram showing a wireless communication system, 1000, according to an example embodiment. Wireless communication system 1000 may include a first wireless communication device 1100 and a second wireless communication device 1200. The wireless communication system 1000 may, as non-limited examples, be a Long Term Evolution (LTE) system, an LTE-Advance (LTE-A) system, a code-division multiple access (CDMA) system, a Global System for Mobile communications (GSM) system, a wireless local area network (LAN) (WLAN) system, a Wireless Fidelity (WiFi) system, a Bluetooth system, a Zigbee system, a near-field communication (NFC) system, a magnetic secure transmission (MST) system, a radio frequency (RF) system, or a Body Area Network (BAN) system.

The first wireless communication device 1100 and the second wireless communication device 1200 may be any of various devices that may communicate with one another to transmit and receive data and/or control information. For example, each of devices 1100, 1200 may be user equipment (UE) or a base station. The UE, which is a wireless communication device, may be fixed or movable, and may be referred to as terminal equipment, a mobile station (MS), a mobile terminal (MT), a user terminal (UT), a subscriber station (SS), a wireless device, a handheld device, and the like. The base station (BS) may generally be a fixed station that communicates with other UEs and base stations and may be referred to as Node B, evolved-Node B (eNB), a base transceiver system (BTS), and the like. In another embodiment, each of the first wireless communication device 1100 and the second wireless communication device 1200 may be a client or an access point (AP). The client may, based on WiFi communication, form a communication connection with the AP.

A wireless communication network between devices 1100 and 1200 may support communication between a plurality of users by sharing available network resources. For example, in the wireless communication network, information may be transmitted and/or received with various methods including, for example, code division multiple access (CDMA), frequency division multiple access (FDMA), time division multiple access (TDMA), orthogonal frequency division multiple access), single carrier frequency division multiple access (SC-FDMA), and the like.

The first wireless communication device 1100 may include a first radio frequency integrated chip (RFIC) 1110 and a first antenna Ant1, and the second wireless communication device 1200 may include a second RFIC 1210 and a second antenna Ant2. Each of the first RFIC 1110 and the second RFIC 1210 may include a reference clock generating circuit (RCGC) 10 as described above with reference to FIGS. 1-8, and a mixer M. The mixer in each of the first RFIC 1110 and the second RFIC 1210 may transmit or receive a signal Sig based on the reference clock clk, which is generated based on the oscillating signal f1.

According to the inventive concept, a crystal oscillator including at least one operational amplifier that forms one or more feedback loops may be used for eliminating noise in drive current applied to a crystal circuit, and broadens a range for adjusting a frequency of an oscillating signal generated with the crystal circuit.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A crystal oscillator configured to generate an oscillating signal based on a natural frequency of a crystal, the crystal oscillator comprising:
a current generating circuit connected to a first node having a first voltage and a second node having a second voltage, the current generating circuit being configured to output a first current to the second node;
a feedback circuit connected to the current generating circuit via the first node and the second node and configured to adjust a level of the second voltage by controlling a level of the first voltage;
a crystal circuit connected to the second node and configured to generate the oscillating signal based on the second voltage; and a positive feedback prevention circuit configured to prevent positive feedback by the feedback circuit by controlling a phase difference between the first voltage and the second voltage.

2. The crystal oscillator of claim 1, wherein
the feedback circuit comprises an operational amplifier (OPAMP) comprising an output terminal connected to the first node, a first input terminal connected to the second node, and a second input terminal connected to a third node,
a third voltage is applied to the third node, and
the OPAMP, by controlling the first voltage of the first node, adjusts the level of the second voltage to be approximately equal to a level of the third voltage.

3. The crystal oscillator of claim 2, further comprising
a voltage generating circuit configured to apply the third voltage to the third node; and
a first noise eliminating circuit connected to the third node and configured to block noise generated from the voltage generating circuit.

4. The crystal oscillator of claim 3, wherein
the first noise eliminating circuit comprises:
a first resistor connected between the voltage generating circuit and the third node; and
a first capacitor connected to the third node and a reference ground, wherein the first resistor and the first capacitor form a low pass filter.

5. The crystal oscillator of claim 2, further comprising
a second noise eliminating circuit coupled between the first input terminal of the OPAMP and the second node and configured to eliminate noise in the second voltage.

6. The crystal oscillator of claim 5, wherein
the second noise eliminating circuit comprises a second resistor connected between the first input terminal of the OPAMP and the second node.

7. The crystal oscillator of claim 2, wherein
the crystal circuit is connected between the second node and a fourth node,
and the crystal oscillator further comprises a node voltage adjusting circuit configured to adjust a voltage level at the fourth node to be approximately equal to the voltage level at the second node.

8. The crystal oscillator of claim 7, wherein
the node voltage adjusting circuit comprises a third resistor connected between the third node and the fourth node and configured to adjust the voltage levels of the fourth node and the second node to be approximately equal to each other by adjusting the voltage level at the fourth node to be approximately equal to the level of the third voltage.

9. The crystal oscillator of claim 1, wherein
the current generating circuit comprises a first transistor, the first transistor comprising a gate terminal connected to the first node, a first end to which a supply voltage is applied, and a second end connected to the second node.

10. The crystal oscillator of claim 1, wherein
the positive feedback prevention circuit is connected between the first node and the second node and comprises a second capacitor and a fourth resistor serially connected to each other.

11. The crystal oscillator of claim 10, wherein
the positive feedback prevention circuit further comprises a first transistor and a current source, wherein the first transistor comprises a gate terminal connected to the second node and an end connected to the fourth resistor, and the current source is configured to provide a current to the end of the first transistor.

12. The crystal oscillator of claim 10, wherein
the positive feedback prevention circuit is connected between the first node and the second node, and further comprises
a second transistor having a gate terminal connected to the second node and an end connected to the second capacitor, and a current source configured to provide a current to the end of the second transistor.

13. The crystal oscillator of claim 1, further comprising
a feedback switch circuit configured to determine whether the feedback circuit performs a feedback operation by selectively connecting, to the first node, an output terminal of the feedback circuit and a gate voltage, based on a feedback enable signal.

14. The crystal oscillator of claim 1, wherein the crystal circuit comprises the crystal, a field effect transistor (FET), and a frequency tuning circuit, wherein the crystal is connected between a gate and an end of the FET.

15. The crystal oscillator of claim 1, wherein the current generating circuit is configured to output the first current to the second node based on an externally provided current control signal.

16. A crystal oscillator configured to generate an oscillating signal based on a natural frequency of a crystal, the crystal oscillator comprising:
a first transistor comprising an end to which a supply voltage is applied, and a gate terminal connected to a first node;
a second transistor comprising a gate terminal to which a reference voltage is applied, a first end connected to another end of the first transistor, and a second end connected to a second node;
a crystal circuit connected between the second node and a fourth node and configured to generate the oscillating signal based on a second voltage at the second node;
an operational amplifier (OPAMP) having an output terminal connected to the first node, a first input terminal connected to the second node, and a second input terminal connected to a third node;
a voltage generating circuit configured to apply a predetermined voltage to the third node;
a first resistor connected between the voltage generating circuit and the third node;
a first capacitor connected to the third node; and
a second resistor connected between the third node and the fourth node.

17. The crystal oscillator of claim 16, further comprising:
a third resistor connected between the first input terminal of the OPAMP and the second node;
a second capacitor connected to the first node;
a fourth resistor serially connected to the second capacitor;
a third transistor having a gate terminal connected to the second node, and an end connected to the fourth resistor; and
a current source configured to provide a current to the end of the first transistor.

18. A reference clock generating circuit comprising:
a crystal oscillator configured to generate an oscillating signal based on a natural frequency of a crystal; and
a clock generator configured to output control signals to the crystal oscillator and generate a first clock signal based on the oscillating signal received from the crystal oscillator,
wherein the crystal oscillator comprises:

a current generating circuit configured to receive a first voltage from a first node and adjust, based on a current control signal received from the clock generator, an amount of a first current that is output to a second node;

a feedback circuit configured to adjust a level of a second voltage of the second node to be approximately equal to a level of a third voltage of a third node by controlling the first voltage via a feedback operation with respect to the current generating circuit;

a crystal circuit connected between the second node and a fourth node and configured to generate the oscillating signal based on the second voltage; and a node voltage adjusting circuit comprising a third resistor connected between the third node and the fourth node and configured to adjust voltage levels of the fourth node and the second node to be approximately equal to each other by adjusting the voltage level at the fourth node to be approximately equal to the third voltage.

19. The crystal oscillator of claim 16, further comprising a positive feedback prevention circuit configured to prevent positive feedback by the OPAMP by controlling a phase difference between a first voltage of the first node and the second voltage of the second node.

\* \* \* \* \*